(12) United States Patent
Yim et al.

(10) Patent No.: US 10,553,651 B2
(45) Date of Patent: Feb. 4, 2020

(54) ORGANIC LIGHT-EMITTING DISPLAY APPARATUS

(71) Applicant: Samsung Display Co., Ltd., Yongin-si, Gyeonggi-do (KR)

(72) Inventors: Sanghoon Yim, Yongin-si (KR); Donghoon Kim, Yongin-si (KR); Samil Kho, Yongin-si (KR); Mikyung Kim, Yongin-si (KR); Eunkyoung Kim, Yongin-si (KR); Seunggak Yang, Yongin-si (KR); Kwanhee Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/016,145

(22) Filed: Jun. 22, 2018

(65) Prior Publication Data
US 2019/0043931 A1    Feb. 7, 2019

(30) Foreign Application Priority Data
Aug. 4, 2017 (KR) .................. 10-2017-0099092

(51) Int. Cl.
*H01L 27/32* (2006.01)
*H01L 51/52* (2006.01)

(52) U.S. Cl.
CPC ...... *H01L 27/3211* (2013.01); *H01L 51/5253* (2013.01); *H01L 51/5275* (2013.01)

(58) Field of Classification Search
CPC ............. H01L 27/3211; H01L 51/5253; H01L 51/5265; H01L 51/5275; H01L 51/5004; H01L 2251/5315
See application file for complete search history.

(56) References Cited

U.S. PATENT DOCUMENTS

| 8,415,874 B2 | 4/2013 | Song et al. |
| 9,343,510 B2 | 5/2016 | Choi |
| 9,768,413 B2 | 9/2017 | Yim et al. |
| 2006/0113907 A1* | 6/2006 | Im .................... H01L 51/5275 313/512 |

(Continued)

FOREIGN PATENT DOCUMENTS

| CN | 106298843 A | 1/2017 |
| JP | 5335168 | 8/2013 |

(Continued)

*Primary Examiner* — Peniel M Gumedzoe
(74) *Attorney, Agent, or Firm* — Lewis Roca Rothgerber Christie LLP

(57) ABSTRACT

An organic light-emitting display apparatus includes a first sub-pixel, a second sub-pixel, and a third sub-pixel configured to emit different colors of light. The organic light-emitting display apparatus includes: a substrate; first through third pixel electrodes; a first organic emission layer configured to emit light having a first wavelength; a second organic emission layer configured to emit light having a second wavelength; a third organic emission layer configured to emit light having a third wavelength; an opposite electrode; a capping layer over the opposite electrode and having a refractive index with respect to the first wavelength that is higher than a refractive index with respect to the second wavelength by at least 7%; and a thin-film encapsulation layer over the capping layer.

20 Claims, 11 Drawing Sheets

(56) References Cited

U.S. PATENT DOCUMENTS

| | | | |
|---|---|---|---|
| 2011/0084291 A1* | 4/2011 | Jeong | H01L 27/3211 |
| | | | 257/89 |
| 2014/0138636 A1* | 5/2014 | Song | H01L 51/5262 |
| | | | 257/40 |
| 2015/0287920 A1 | 10/2015 | Nagaoka et al. | |
| 2017/0098686 A1* | 4/2017 | Jeong | H01L 27/3211 |
| 2017/0133437 A1* | 5/2017 | Komatsu | H01L 27/3206 |

FOREIGN PATENT DOCUMENTS

| | | |
|---|---|---|
| KR | 10-1182447 | 9/2012 |
| KR | 10-2015-0004099 | 1/2015 |
| KR | 10-2015-0076740 | 7/2015 |

\* cited by examiner

FIG. 5

| WAVELENGTH | COMPARATIVE EXAMPLE | CPLa | CPLb | CPLc | CPLd | CPLe | CPLf | CPLg | CPLh | CPLi |
|---|---|---|---|---|---|---|---|---|---|---|
| 460 nm | 1.987 | 2.202 | 2.122 | 2.2 | 2.205 | 2.193 | 2.19 | 2.338 | 2.284 | 2.338 |
| 530 nm | 1.902 | 1.986 | 1.962 | 1.99 | 2.038 | 2.008 | 2.01 | 2.105 | 2.101 | 2.138 |
| 620 nm | 1.855 | 1.91 | 1.895 | 1.913 | 1.964 | 1.936 | 1.94 | 2.014 | 2.012 | 2.057 |
| 460 nm | 1.045 | 1.109 | 1.082 | 1.106 | 1.082 | 1.092 | 1.090 | 1.111 | 1.087 | 1.094 |
| 530 nm | 1.000 | 1.000 | 1.000 | 1.000 | 1.000 | 1.000 | 1.000 | 1.000 | 1.000 | 1.000 |
| 620 nm | 0.975 | 0.962 | 0.966 | 0.961 | 0.964 | 0.964 | 0.964 | 0.957 | 0.958 | 0.962 |

(COMPARATIVE EXAMPLE)

(EXAMPLE (CPLf))

ORGANIC LIGHT-EMITTING DISPLAY APPARATUS

CROSS-REFERENCE TO RELATED APPLICATION

This application claims priority to and the benefit of Korean Patent Application No. 10-2017-0099092, filed on Aug. 4, 2017, in the Korean Intellectual Property Office, the disclosure of which is incorporated herein in its entirety by reference.

BACKGROUND

1. Field

One or more embodiments relate to organic light-emitting display apparatuses, and more particularly, to an organic light-emitting display apparatus including a capping layer and a thin-film encapsulation layer.

2. Description of the Related Art

An organic light-emitting display apparatus includes an organic light-emitting device (OLED) including a hole injection electrode, an electron injection electrode, and an organic emission layer formed therebetween, and is a self-emission-type display apparatus that generates light as excitons transit from an excited state to a ground state, wherein the excitons are generated when holes injected from the hole injection electrode and electrons injected from the electron injection electrode combine in the organic emission layer.

Here, a capping layer may be disposed over the OLED so as to increase a light-emission efficiency of the organic light-emitting display apparatus.

Recently, studies for realizing the organic light-emitting display apparatus as a flexible display apparatus are actively performed, and the flexible display apparatus may include a flexible substrate and a flexible protection layer protecting the OLED. Accordingly, light emitted from the OLED is affected by characteristics of the capping layer and the flexible protection layer.

A structure in which light efficiency is increased by introducing a microcavity inside the organic light-emitting display apparatus has been suggested. In a top emission-type OLED, a pixel electrode of the top emission OLED may be a reflective electrode and an opposite electrode facing the pixel electrode may be a semi-transmissive electrode.

SUMMARY

One or more embodiments include an organic light-emitting display apparatus having high light efficiency and color deviation as a function of viewing angles in a direction in which a user does not easily detect the color deviation.

Additional aspects will be set forth in part in the description which follows and, in part, will be apparent from the description, or may be learned by practice of the presented embodiments.

According to one or more embodiments, an organic light-emitting display apparatus includes a first sub-pixel, a second sub-pixel, and a third sub-pixel configured to emit different colors of light, the organic light-emitting display apparatus includes: a substrate including first through third regions respectively corresponding to the first through third sub-pixels; first through third pixel electrodes respectively in the first through third regions of the substrate; a first organic emission layer over the first pixel electrode and configured to emit light having a first wavelength; a second organic emission layer over the second pixel electrode and configured to emit light having a second wavelength, the second wavelength being longer than the first wavelength; a third organic emission layer over the third pixel electrode and configured to emit light having a third wavelength, the third wavelength being longer than the second wavelength; an opposite electrode covering the first through third organic emission layers; a capping layer over the opposite electrode and having a refractive index with respect to the first wavelength that is higher than a refractive index with respect to the second wavelength by at least 7%; and a thin-film encapsulation layer over the capping layer.

A refractive index of the capping layer with respect to the third wavelength may be less than the refractive index with respect to the second wavelength by at least 3%.

The first through third organic emission layers may be respectively configured to emit a blue light, a green light, and a red light, and the first through third wavelengths may be respectively 460 nm, 530 nm, and 620 nm.

The capping layer may have the refractive index of 1.9 to 2.3 with respect to the second wavelength.

The capping layer may be continuously disposed throughout the first through third sub-pixels, and a thickness of the capping layer may be substantially uniform.

The thickness of the capping layer may be 600 Å to 750 Å.

The thin-film encapsulation layer may include a first encapsulation inorganic film, an encapsulation organic film over the first encapsulation inorganic film, and a second encapsulation inorganic film over the encapsulation organic film.

The first encapsulation inorganic film may include a first lower encapsulation inorganic film contacting the capping layer and a first upper encapsulation inorganic film over the first lower encapsulation inorganic film.

The first lower encapsulation inorganic film may include lithium fluoride (LiF).

A refractive index ($n_e$) of the opposite electrode, a refractive index ($n_c$) of the capping layer, a refractive index ($n_1$) of the first lower encapsulation inorganic film, a refractive index ($n_2$) of the first upper encapsulation inorganic film, and a refractive index ($n_3$) of the encapsulation organic film may satisfy a condition $n_c > n_2 > n_3 > n_1 > n_e$.

A resonance efficiency of the first sub-pixel may be higher than resonance efficiencies of the second and third sub-pixels by at least 50%.

The organic light-emitting display apparatus may further include: a first lower functional layer between the first pixel electrode and the first organic emission layer; a second lower functional layer between the second pixel electrode and the second organic emission layer; and a third lower functional layer between the third pixel electrode and the third organic emission layer, wherein the first through third lower functional layers may have different thicknesses.

The refractive index of the capping layer with respect to the first wavelength may be higher than the refractive index of the capping layer with respect to the second wavelength by between 8% and 15%.

According to one or more embodiments, an organic light-emitting display apparatus including a first sub-pixel, a second sub-pixel, and a third sub-pixel configured to emit different color lights, the organic light-emitting display apparatus includes: first through third pixel electrodes respectively in the first through third sub-pixels; a first organic emission layer disposed over the first pixel electrode and configured to emit a blue light including a light of a first wavelength; a second organic emission layer over the second pixel electrode and configured to emit a green light including a light of a second wavelength, the second wavelength being longer than the first wavelength; a third organic emission layer over the third pixel electrode and configured to emit a red light including a light of a third wavelength, the third wavelength being longer than the second wavelength; an opposite electrode continuously disposed over the first through third organic emission layers; and a capping layer over the opposite electrode continuously throughout the first through third sub-pixels in a substantially uniform thickness, and having a refractive index with respect to the first wavelength that is higher than a refractive index with respect to the second wavelength by at least 7%.

The organic light-emitting display apparatus may further include a thin-film encapsulation layer over the capping layer to contact the capping layer.

The thin-film encapsulation layer may include a first lower encapsulation inorganic film, a first upper encapsulation inorganic film, an encapsulation organic film, and a second encapsulation inorganic film, which are sequentially disposed.

Refractive indexes of the first lower encapsulation inorganic film, the first upper encapsulation inorganic film, the encapsulation organic film, and the second encapsulation inorganic film may be respectively 1.35 to 1.45, 1.7 to 1.85, 1.45 to 1.55, and 1.7 to 1.85.

The refractive index of the capping layer with respect to the third wavelength may be less than the refractive index with respect to the second wavelength by at least 3%.

The capping layer may have a refractive index of 1.9 to 2.3 with respect to the second wavelength.

A thickness of the capping layer may be 600 Å to 750 Å.

BRIEF DESCRIPTION OF THE DRAWINGS

These and/or other aspects will become apparent and more readily appreciated from the following description of the embodiments, taken in conjunction with the accompanying drawings in which:

FIG. 5 is a table of refractive indexes of capping layers of a Comparative Example and of FIG. 4 at 460 nm, 530 nm, and 620 nm;

DETAILED DESCRIPTION

Figure 1:
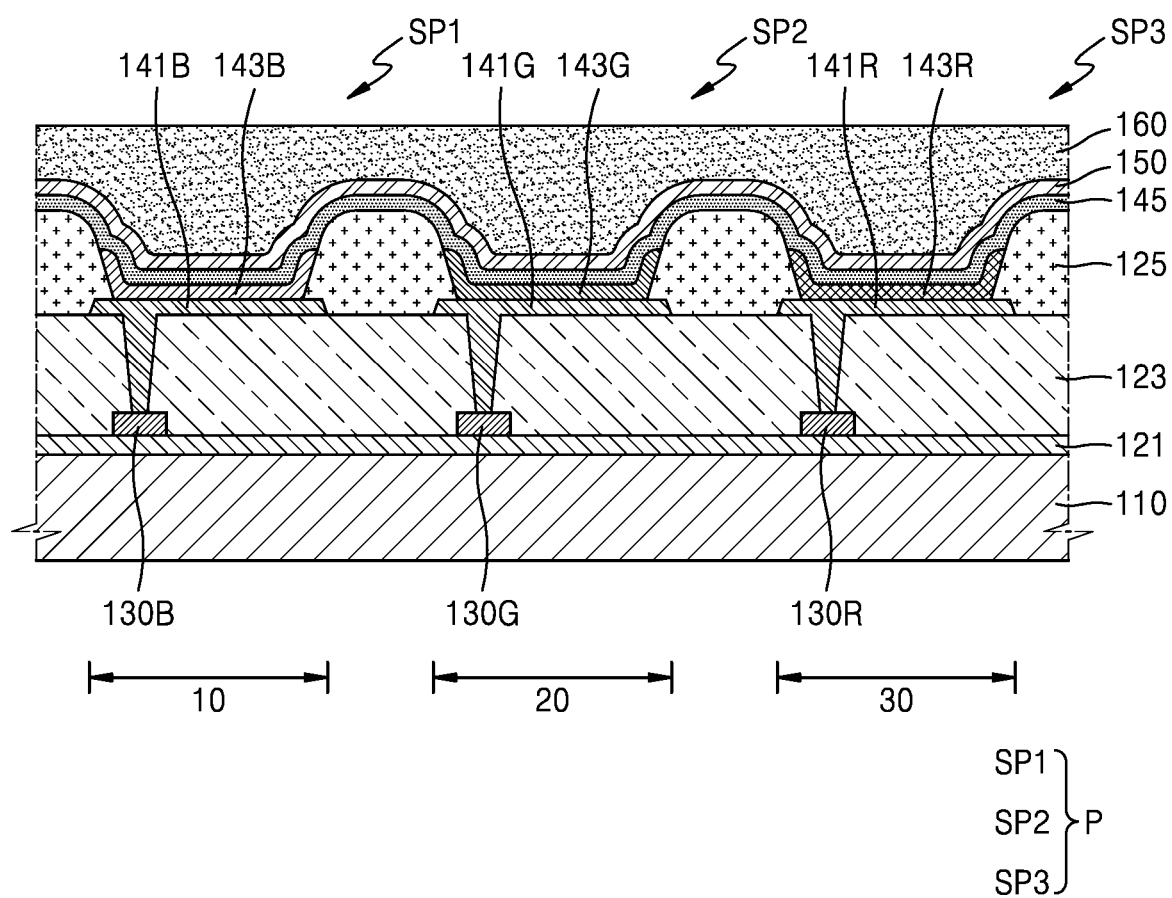
FIG. 1 is a cross-sectional view of an organic light-emitting display apparatus according to an embodiment.

As the disclosure allows for various suitable changes and numerous embodiments, particular embodiments will be illustrated in the drawings and described in detail in the written description. In this regard, the present embodiments may have different forms and should not be construed as being limited to the descriptions set forth herein. Accordingly, the embodiments are merely described below, by referring to the figures, to explain aspects of the present description.

As used herein, the term "and/or" includes any and all combinations of one or more of the associated listed items. Expressions such as "at least one of," "one of," and "selected from," when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration.

It will be understood that, although the terms "first," "second," "third," etc., may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the spirit and scope of the present invention.

The terminology used herein is for the purpose of describing particular embodiments and is not intended to be limiting of the present invention. As used herein, the singular forms "a" and "an" are intended to include the plural forms as well, unless the context clearly indicates otherwise.

It will be further understood that the terms "comprise," "comprises," "comprising," "includes," "including," and "include," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to," "coupled to," "connected with," "coupled with," or "adjacent to" another element or layer, it can be "directly on," "directly connected to," "directly coupled to," "directly connected with," "directly coupled with," or "directly adjacent to" the other element or layer, or one or more intervening elements or layers may be present. Furthermore, "connection," "connected," etc., may also refer to "electrical connection," "electrically connected," etc., depending on the context in which such terms are used as would be understood by those skilled in the art. When an element or layer is referred to as being "directly on," "directly connected to," "directly coupled to," "directly connected with," "directly coupled with," or "immediately adjacent to" another element or layer, there are no intervening elements or layers present.

Features described in relation to one or more embodiments of the present invention are available for use in conjunction with features of other embodiments of the present invention. For example, features described in a first embodiment may be combined with features described in a second embodiment to form a third embodiment, even though the third embodiment may not be specifically described herein.

Sizes of elements (or components) in the drawings may be exaggerated for convenience of explanation. In other words, because sizes and thicknesses of components in the drawings are arbitrarily illustrated for convenience of explanation, the following embodiments are not limited thereto.

Spatially relative terms, such as "top," "bottom," "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

Further, it will also be understood that when one element, component, region, layer, and/or section is referred to as being "between" two elements, components, regions, layers, and/or sections, it can be the only element, component, region, layer, and/or section between the two elements, components, regions, layers, and/or sections, or one or more intervening elements, components, regions, layers, and/or sections may also be present.

As used herein, "substantially," "about," and similar terms are used as terms of approximation and not as terms of degree, and are intended to account for the inherent deviations in measured or calculated values that would be recognized by those of ordinary skill in the art.

As used herein, the terms "use," "using," and "used" may be considered synonymous with the terms "utilize," "utilizing," and "utilized," respectively.

Also, any numerical range recited herein is intended to include all sub-ranges of the same numerical precision subsumed within the recited range. For example, a range of "1.0 to 10.0" or between "1.0 and 10.0" is intended to include all sub-ranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such sub-ranges would comply with the requirements of 35 U.S.C. § 112, first paragraph, and 35 U.S.C. § 132(a).

According to an embodiment of the present invention, because resonance may not be satisfactory and thus light efficiency may be decreased when reflectivity of the opposite electrode is not high, the capping layer may be disposed over the opposite electrode to increase the light efficiency. The capping layer may have different refractive indexes as a function of wavelengths, and the value of color deviation (or variation) as a function of light efficiencies and viewing angles may vary as a function of the refractive indexes of the capping layer.

For example, a flexible organic light-emitting display apparatus may include a thin-film encapsulation layer contacting a capping layer, and a high light efficiency and desired value of color deviation may be realized by determining optical characteristics of the capping layer considering optical characteristics of the thin-film encapsulation layer.

Reference will now be made to embodiments, examples of which are illustrated in the accompanying drawings. Those components that are the same or substantially the same may have the same reference numeral regardless of the figure number, and redundant explanations may be omitted.

Figure 2:
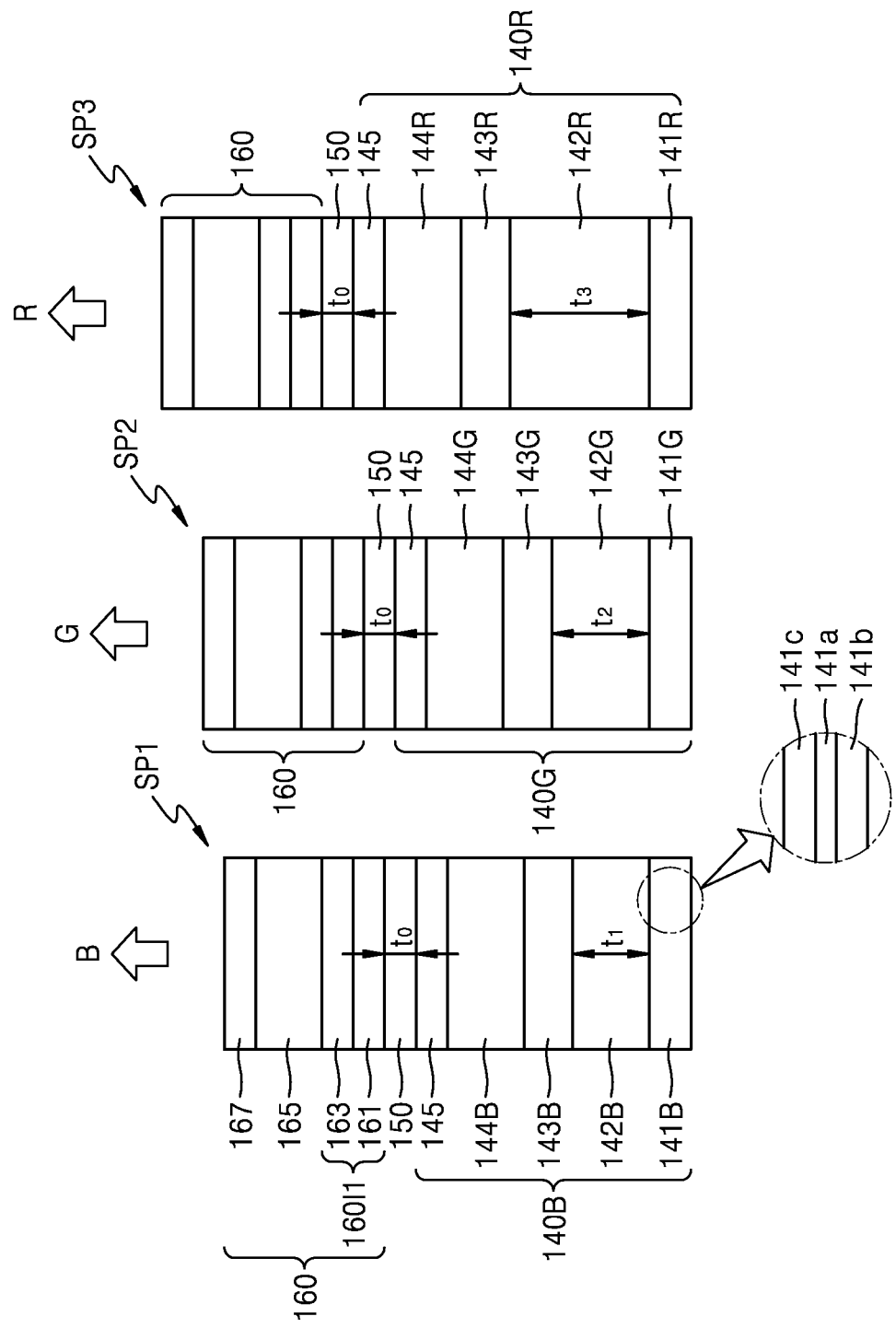
FIG. 2 is a cross-sectional view of a stacked structure of a first sub-pixel, a second sub-pixel, and a third sub-pixel of FIG. 1.

FIG. 1 is a cross-sectional view of an organic light-emitting display apparatus according to an embodiment, and FIG. 2 is a cross-sectional view of a stacked structure of a first sub-pixel SP1, a second sub-pixel SP2, and a third sub-pixel SP3 of FIG. 1.

Referring to FIGS. 1 and 2, the organic light-emitting display apparatus according to an embodiment includes the first through third sub-pixels SP1 through SP3 emitting (or configured to emit) different colors of light, and includes: a substrate 110 including first through third regions 10 through 30 respectively corresponding to the first through third sub-pixels SP1 through SP3; first through third pixel electrodes 141B, 141G, and 141R respectively disposed over the first through third regions 10 through 30 of the substrate 110; a first organic emission layer 143B disposed over the first pixel electrode 141B and emitting light having a first wavelength; a second organic emission layer 143G disposed over the second pixel electrode 141G and emitting light having a second wavelength longer than the first wavelength; a third organic emission layer 143R disposed over the third pixel electrode 141R and emitting light having a third wavelength longer than the second wavelength; an opposite electrode 145 covering the first through third organic emission layers 143B, 143G, and 143R; a capping layer 150 disposed over the opposite electrode 145; and a thin-film encapsulation layer 160 disposed over the capping layer 150.

The organic light-emitting display apparatus displays an image by using a plurality of pixels P each emitting a certain color light based on a selective combination of lights emitted from the first through third sub-pixels SP1 through SP3.

According to an embodiment, the first through third sub-pixels SP1 through SP3 may respectively emit a blue light, a green light, and a red light. In other words, the first organic emission layer 143B may emit a blue light including the light of the first wavelength, the second organic emission layer 143G may emit a green light including the light of the second wavelength, and the third organic emission layer 143R may emit a red light including the light of the third wavelength. The first through third wavelengths may respectively be 460 nm, 530 nm, and 620 nm. However, an embodiment is not limited thereto, and the first through third organic emission layers 143B through 143R may emit other suitable different color lights.

The organic light-emitting display apparatus may be a flexible organic light-emitting display apparatus, and the substrate 110 may be a flexible substrate that is easily bent. Such a flexible substrate may include various suitable materials, and for example, may include a polymer resin, such as polyethersulphone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), and/or cellulose acetate propionate (CAP). According to an embodiment, the substrate 110 may include PI having an excellent bendable characteristic, and may have a thickness of several to tens of micrometers (μm).

First through third pixel drivers 130B, 130G, and 130R respectively electrically connected to the first through third pixel electrodes 141B, 141G, and 141R are disposed over the substrate 110, and a buffer layer 121 may be disposed between the first through third pixel drivers 130R, 130G, and 130R. The buffer layer 121 may planarize a top surface of the substrate 110, and prevent or substantially prevent impurities from penetrating into the first through third pixel drivers 130B, 130G, and 130R from the substrate 110.

A planarization layer 123 covering the first through third pixel drivers 130R, 130G, and 130R is disposed over the buffer layer 121, and may include a single layer or multi-layer of an inorganic material and/or an organic material. The first through third pixel drivers 130R, 130G, and 130R may each include devices, such as a plurality of thin-film transistors and a capacitor.

Referring to FIG. 2, the first through third sub-pixels SP1 through SP3 respectively include first through third organic light-emitting devices (OLEDs) 140B, 140G, and 140R. The opposite electrode 145, the capping layer 150, and the thin-film encapsulation layer 160 may be continuously disposed throughout the first through third regions 10 through 30 of the substrate 110 to cover the first through third organic emission layers 143B, 143G, and 143R.

The first through third OLEDs 140B, 140G, and 140R may form a microcavity, and the first through third pixel electrodes 141B, 141G, and 141R may be reflective electrodes. In other words, the organic light-emitting display apparatus may be a top emission-type display apparatus in which lights emitted from the first through third organic emission layers 143B, 143G, and 143R are externally discharged through the opposite electrode 145.

The first through third pixel electrodes 141B, 143G, and 141R may each include a reflective layer 141a and transparent conductive layers 141b and 141c respectively disposed below and on the reflective layer 141a. The transparent conductive layers 141b and 141c may each include at least one selected from indium tin oxide (ITO), indium zinc oxide (IZO), zinc oxide (ZnO), indium oxide ($In_2O_3$), indium gallium oxide (IGO), and aluminum zinc oxide (AZO), and the reflective layer 141a may include at least one selected from silver (Ag), Al, magnesium (Mg), lithium (Li), calcium (Ca), copper (Cu), lithium fluoride (LiF)/Ca, LiF/Al, Mg/Ag, and CaAg. For example, the first through third pixel electrodes 141B, 141G, and 141R may be a triple layer of ITO/Ag/ITO.

The opposite electrode 145 may include at least one of Li, Ca, LiF/Ca, LiF/Al, Al, Ag, Mg, and gold (Ag), and may be a single layer or a multilayer. The opposite electrode 145 may be formed of a metal having a very small thickness of several to tens of nm, may have a refractive index lower than 1, and may have a very high extinction coefficient k.

The capping layer 150 may be disposed over the opposite electrode 145, and may have a refractive index of 1.9 to 2.3 at a wavelength of about 530 nm.

When the capping layer 150 is not disposed over the opposite electrode 145, reflectivity of the lights emitted from the first through third organic emission layers 143B, 143G, and 143R at the opposite electrode 145 is very low. Accordingly, resonance efficiencies of microcavities formed by the first through third pixel electrodes 141B, 141G, and 141R, and the opposite electrode 145 are low, and as a result, a light extracting efficiency of the organic light-emitting display apparatus is low.

In the present disclosure, the capping layer 150 having a relatively high refractive index is disposed over the opposite electrode 145, and the reflectivity of the lights emitted from the first through third organic emission layers 143B, 143G, and 143R at the opposite electrode 145 is high due to the capping layer 150. Accordingly, the resonance efficiencies of the microcavities are high, and thus the light extracting efficiency of the organic light-emitting display apparatus is high.

Here, reflection at the opposite electrode 145 may include not only reflection at a bottom surface of the opposite electrode 145, but also reflection at an interface of the opposite electrode 145 and the capping layer 150 as well as reflection at an interface of the capping layer 150 and the thin-film encapsulation layer 160. In other words, a ratio of lights reflected at the opposite electrode 145 and returning back to the first through third organic emission layers 143B, 143G, and 143R to lights emitted from the first through third organic emission layers 143B, 143G, and 143R and incident on the opposite electrode 145 may be defined as reflectivity at the opposite electrode 145, and "resonance efficiency" may also be defined by the same or substantially the same concept as the reflectivity at the opposite electrode 145.

The reflectivity, i.e., the resonance efficiency, at the opposite electrode 145 may vary according to refractive indexes of the capping layer 150. In other words, light extracting efficiencies of the first through third sub-pixels SP1 through SP3 may each vary according to refractive indexes of the capping layer 150 with respect to a wavelength of an emitted light.

A first lower function layer 142B may be disposed between the first pixel electrode 141B and the first organic emission layer 143B, a second lower functional layer 142G may be disposed between the second pixel electrode 141G and the second organic emission layer 143G, and a third lower function layer 142R may be disposed between the third pixel electrode 141R and the third organic emission layer 143R. The first through third lower functional layers 142B, 142G, and 142R may each be a hole injection layer, a hole transport layer, and/or another functional layer.

According to an embodiment, thicknesses $t_1$ through $t_3$ of the first through third lower functional layers 142B, 142G, and 142R may be different from each other. In order to increase the light extracting efficiencies of the first through third sub-pixels SP1 through SP3, distances between the first through third pixel electrodes 141B, 141G, and 141R, and the opposite electrode 145 may be set to satisfy a constructive interference condition. In other words, because wavelengths of the lights emitted from the first through third OLEDs 140B, 140G, and 140R are different from each other, resonance distances between the first pixel electrode 141B and the opposite electrode 145, between the second pixel electrode 141G and the opposite electrode 145, and between the third pixel electrode 141R and the opposite electrode 145 are different from each other, and the first through third lower functional layers 142B, 142G, and 142R may function as resonance distance-adjusting layers for adjusting such resonance distances.

First through third upper functional layers 144B, 144G, and 144R may be respectively disposed between the first organic emission layer 143B and the opposite electrode 145, between the second organic emission layer 143G and the opposite electrode 145, and between the third organic emission layer 143R and the opposite electrode 145. The first through third upper functional layers 144B, 144G, and 144R may be an electron injection layer, an electron transport layer, and/or another functional layer.

In FIG. 2, the first through third lower functional layers 142B, 142G, and 142R function as the resonance distance-adjusting layers, and the first through third upper functional layers 144B, 144G, and 144R have the same or substantially the same thicknesses, but an embodiment is not limited thereto. In other words, the first through third upper functional layers 144B, 144G, and 144R may function as resonance distance-adjusting layers, or all of the first through third lower functional layers 142B, 142G, and 142R and the first through third upper functional layers 144B, 144G, and 144R may function as resonance distance-adjusting layers. Also, at least some of the first through third lower functional layers 142B, 142G, and 142R and the first through third upper functional layers 144B, 144G, and 144R may be continuously formed throughout the first through third sub-pixels SP1 through SP3, or may be disposed respectively in the first through third sub-pixels SP1 through SP3.

The capping layer 150 having a substantially uniform thickness $t_0$ throughout the first through third sub-pixels SP1 through SP3 may be disposed over the opposite electrode 145. According to an embodiment, the thickness $t_0$ of the capping layer 150 may be from 600 Å to 900 Å. For example, the thickness $t_0$ of the capping layer 150 may be from 600 Å to 750 Å.

The capping layer 150 may have the refractive index of 1.9 to 2.3 at 530 nm (the second wavelength), the refractive index at 460 nm (the first wavelength) may be higher than the refractive index at 530 nm (the second wavelength) by at least 7%, and the refractive index at 620 nm (the third wavelength) may be less than the refractive index at 530 nm (the second wavelength) by at least 3%. For example, the refractive index of the capping layer 150 at 460 nm may be higher than the refractive index at 530 nm by 8% to 15%.

According to an embodiment, the capping layer 150 may include a triamine derivative, a carbazole biphenyl derivative, an arylenediamine derivative, or tris(8-hydroxyquinolinato)aluminum (Alq3), and by adjusting a composition of such a derivative, a material having a refractive index according to wavelengths described above may be realized.

The thin-film encapsulation layer 160 contacting the capping layer 150 is disposed over the capping layer 150, and the thin-film encapsulation layer 160 may include a first encapsulation inorganic film 160I1 disposed as a lowest layer, an encapsulation organic film 165, and a second encapsulation inorganic film 167. According to an embodiment, the first encapsulation inorganic film 160I1 may include a first lower encapsulation inorganic film 161 and a first upper encapsulation inorganic film 163, wherein the first lower encapsulation inorganic film 161 may include LiF.

A refractive index $n_1$ of the first lower encapsulation inorganic film 161 may be 1.35 to 1.45. In other words, the refractive index of the first lower encapsulation inorganic film 161 may be less than the refractive index of the capping layer 150 and higher than 1, i.e., a refractive index of air.

According to an embodiment, the first upper encapsulation inorganic film 163 and the second encapsulation inorganic film 167 may each include any one selected from aluminum oxide ($Al_2O_3$), silicon oxide ($SiO_2$), silicon nitride ($SiN_x$), and silicon oxynitride ($SiO_xN_y$), and the encapsulation organic film 165 may include an acryl-based material.

For example, a refractive index $n_2$ of the first upper encapsulation inorganic film 163, a refractive index $n_3$ of the encapsulation organic film 165, and a refractive index $n_4$ of the second encapsulation inorganic film 167 may respectively be 1.7 to 1.85, 1.45 to 1.55, and 1.7 to 1.85. Such refractive indexes are at a wavelength of 530 nm.

Accordingly, a refractive index $n_e$ of the opposite electrode 145, a refractive index $n_c$ of the capping layer 150, the refractive index $n_1$ of the first lower encapsulation inorganic film 161, the refractive index $n_2$ of the first upper encapsulation inorganic film 163, and the refractive index $n_3$ of the encapsulation organic film 165 may satisfy the following conditional expression, wherein a refractive index $n_4$ of the second encapsulation inorganic film 167 and the refractive index $n_2$ of the first upper encapsulation inorganic film 163 may be substantially the same.

<Conditional Expression>

$n_c > n_2 > n_3 > n_1 > n_e$

The organic light-emitting display apparatus may be a flexible organic light-emitting display apparatus that is bendable, and may use the thin-film encapsulation layer 160 having high flexibility so as to protect the first through third OLEDs 140B, 140G, and 140R that are easily denatured by moisture or oxygen.

Accordingly, the capping layer 150 and the thin-film encapsulation layer 160 contact each other, and the light efficiency and viewing angle characteristics of the organic light-emitting display apparatus may change according to refractive indexes of the capping layer 150 and layers included in the thin-film encapsulation layer 160.

According to an embodiment, the capping layer 150 has a uniform thickness throughout the first through third sub-pixels SP1 through SP3, has a refractive index at 460 nm (the first wavelength) that is higher than the refractive index at 530 nm (the second wavelength) by at least 7%, and has a refractive index at 620 nm (the third wavelength) that is less than the refractive index at 530 nm (the second wavelength) by at least 3%. According to such a configuration, the resonance efficiency of the first sub-pixel SP1 emitting a blue light is higher than the resonance efficiency of the second sub-pixel SP2 emitting a green light, and the resonance efficiency of the third sub-pixel SP3 emitting a red light is less than the resonance efficiency of the second OLED 140G. Such a difference in the resonance efficiencies may increase when a difference in the refractive indexes of the capping layer 150 is increased. However, the thin-film encapsulation layer 160 contacting the capping layer 150 reduces the difference in the resonance efficiencies, and in this regard, in order to increase the difference in the resonance efficiencies of the first through third sub-pixels SP1 through SP3, the refractive index of the capping layer 150 at 460 nm may be higher than the refractive index at 530 nm by at least 7% and the refractive index at 620 nm may be less than the refractive index at 530 nm by at least 3%.

According to such a difference in the resonance efficiencies, color deviation in a side viewing angle with respect to a color in a front viewing angle of the organic light-emitting display apparatus is realized such that blue is further enhanced. In the organic light-emitting display apparatus, the color deviation in the side viewing angle inevitably occurs. When the color deviation is realized such that blue is enhanced, it is difficult for a user, i.e., a viewer, to recognize the color deviation, but when the color deviation is realized such that green or red is enhanced, the user easily recognizes the color deviation.

By setting the refractive index of the capping layer 150 directly affecting a resonance efficiency such that the resonance efficiency of the first sub-pixel SP1 emitting a blue light is higher than the resonance efficiencies of the second and third sub-pixels SP2 and SP3, not only the light efficiency may be increased but also the color deviation in the side viewing angle may be realized such that blue is enhanced.

Figure 3A:
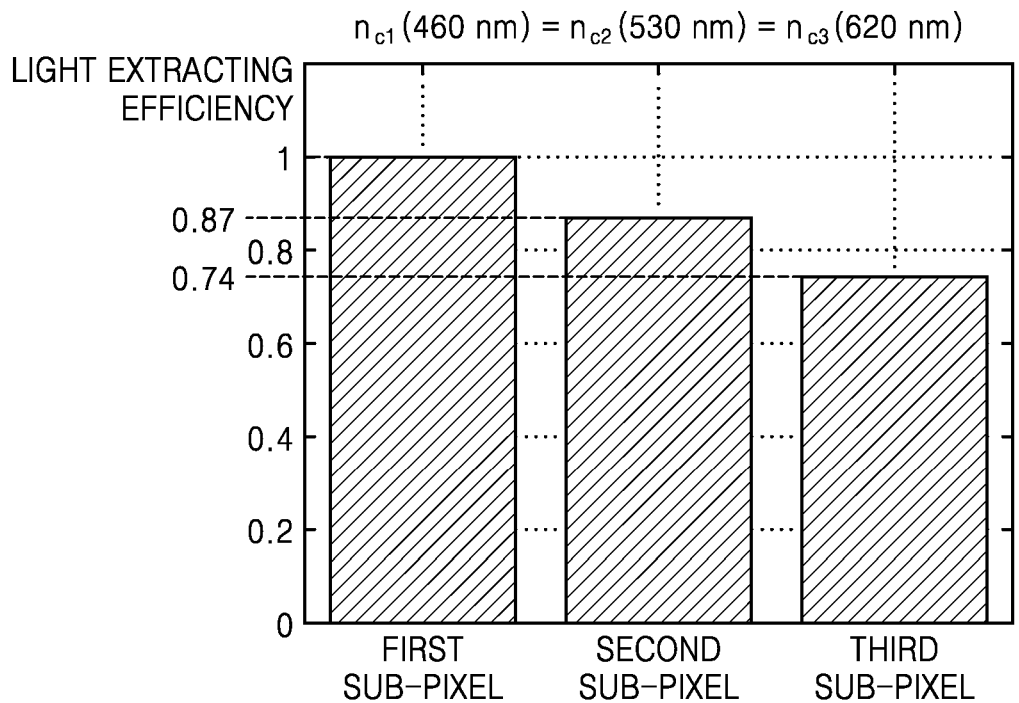
FIG. 3A is a graph of light extracting efficiencies in first through third sub-pixels when refractive indexes of a capping layer in first through third wavelengths are the same.
Figure 3B:
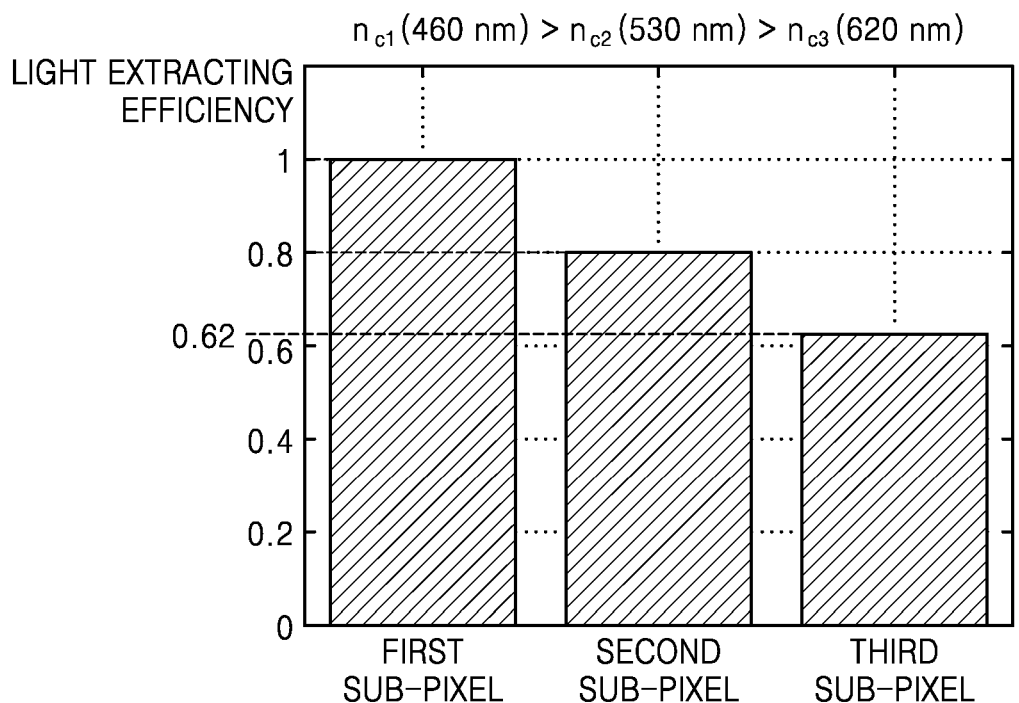
FIG. 3B is a graph of the light extracting efficiencies in the first through third sub-pixels when a condition where the refractive index at the first wavelength>the refractive index at the second wavelength>the refractive index at the third wavelength is satisfied.

FIG. 3A is a graph of light extracting efficiencies in the first through third sub-pixels SP1 through SP3 when refractive indexes of the capping layer 150 in the first through third wavelengths are the same, and FIG. 3B is a graph of the light extracting efficiencies in the first through third sub-pixels SP1 through SP3 when a condition of the refractive index at the first wavelength>the refractive index at the second wavelength>the refractive index at the third wavelength is satisfied.

Both FIGS. 3A and 3B illustrate a case in which, for example, a resonance distance is adjusted such that the light extracting efficiency of the first sub-pixel SP1 emitting a blue light is higher than the light extracting efficiencies of the second sub-pixel SP2 emitting a green light and the third sub-pixel SP3 emitting a red light. In particular, FIG. 3A illustrates relative values of the light extracting efficiencies of the first through third sub-pixels SP1 and SP3 when a refractive index $n_{c1}$ of the capping layer 150 of FIG. 1 at the first wavelength (460 nm), a refractive index $n_{c2}$ at the second wavelength (530 nm), and a refractive index $n_{c3}$ at the third wavelength (620 nm) are the same, and FIG. 3B illustrates the relative values of the light extracting efficiencies of the first through third sub-pixels SP1 through SP3 when $n_{c1}:n_{c2}:n_{c3}$ is 1.2:1.1:1.

It is determined, from the graphs of FIGS. 3A and 3B, that when a difference in the refractive indexes of the capping layer 150 increases, a difference in the light extracting efficiencies between the first through third sub-pixels SP1 through SP3 is increased.

According to an embodiment, by increasing the refractive index of the capping layer 150 at 460 nm, the light extracting efficiency of the first sub-pixel SP1 emitting a blue light including a light of 460 nm may be further increased.

Figure 4:
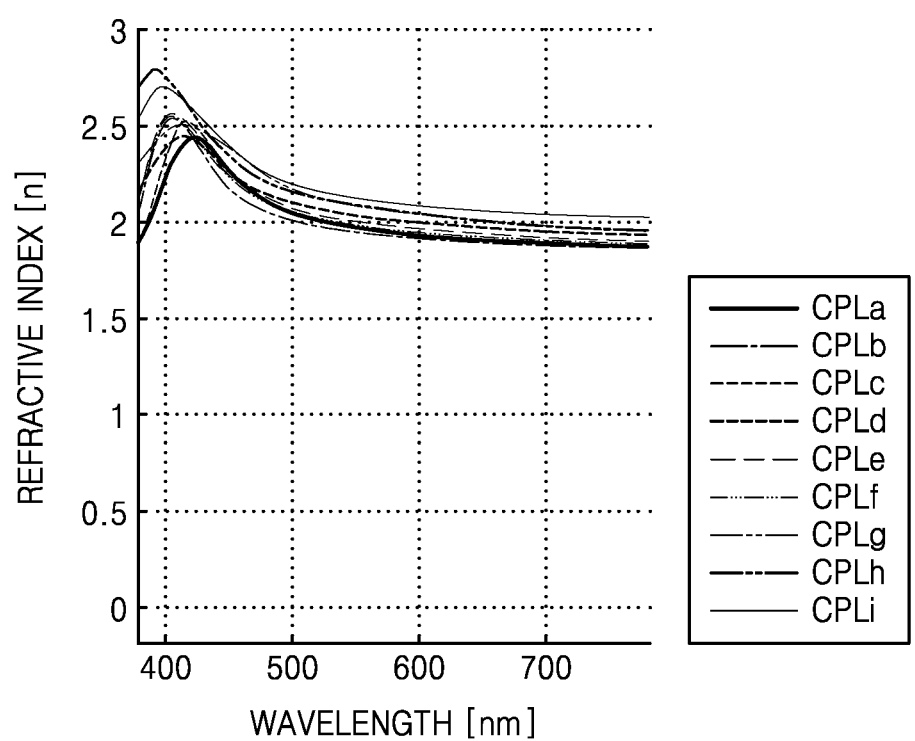
FIG. 4 is a graph of refractive indexes of a capping layer included in embodiments, as a function of wavelengths.
Figure 6A:
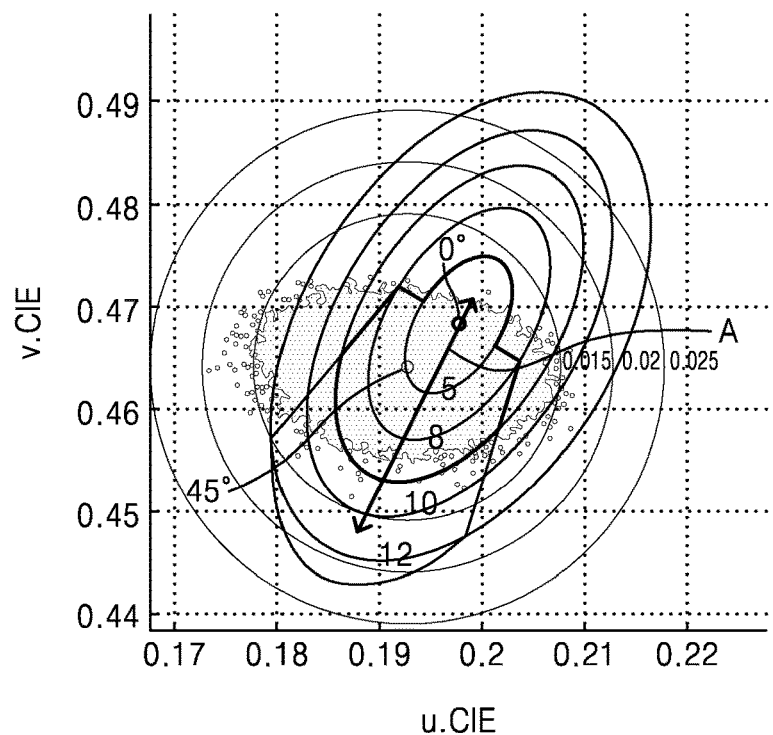
FIGS. 6A and 6B are graphs of color deviation as a function of viewing angles in an ultraviolet (UV) coordinate system respectively in a Comparative Example and an Example (CPLf) of FIG. 5.
Figure 6B:
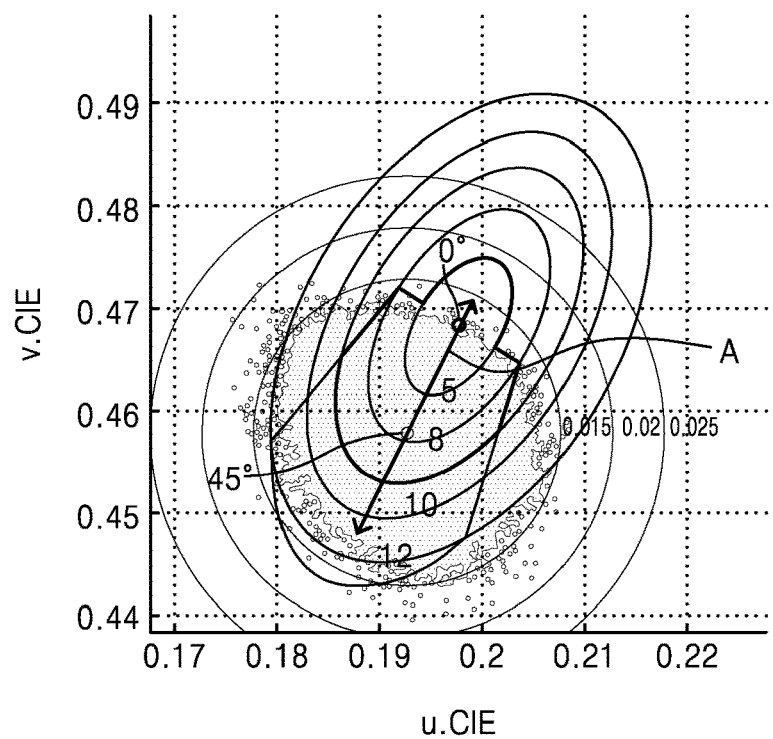

FIG. 4 is a graph of refractive indexes of the capping layer 150 included in embodiments, as a function of wavelengths, FIG. 5 is a table of refractive indexes of a capping layer of a Comparative Example and the capping layer 150 of FIG. 4 at 460 nm, 530 nm, and 620 nm, and FIGS. 6A and 6B are graphs of color deviation as a function of viewing angles in an ultraviolet (UV) coordinate system respectively in the Comparative Example and an Example (CPLf) of FIG. 5.

Referring to FIGS. 4 and 5, the refractive indexes of the capping layer 150 included in the embodiments gradually decrease throughout a range of 460 nm to 620 nm, and in particular, have a very large gradient in a range of 460 nm to 530 nm.

Values in the top three rows of the table of FIG. 5 are refractive indexes of the capping layer 150 at 460 nm, 530 nm, and 620 nm, and values in the bottom three rows of the table are refractive indexes obtained by normalizing the refractive indexes at 530 nm to 1.

In the Comparative Example, the refractive index of the capping layer at 460 nm is higher than the refractive index at 530 nm by 4.5%, and the refractive index at 620 nm is less than the refractive index at 530 nm by 2.5%, whereas in the embodiments, the refractive index of the capping layer 150 at 460 nm is higher than the refractive index at 530 nm by at least 7%, and the refractive index at 620 nm is less than the refractive index at 530 nm by at least 3%. For example, the refractive index of the capping layer 150 at 460 nm may be higher than the refractive index at 530 nm by at least 8%.

FIGS. 6A and 6B illustrate viewing angle characteristics respectively in the Comparative Example and the Example (CPLf) of FIGS. 4 and 5, wherein the graphs of FIGS. 6A and 6B show distributions of color deviation in the UV coordinate system, and it is determined that in the distributions of color deviation in both FIGS. 6A and 6B, Δuv is within a 0.015 range.

However, in the Comparative Example of FIG. 6A, color deviation does not have directivity in a direction (direction indicated by an arrow A) where a user does not recognize color deviation, but color deviation rather occurs in a direction perpendicular to the arrow A. In this case, a viewing angle increases in a side direction with respect to the front, and accordingly, color deviation occurs in a green or red direction instead of a blue direction and thus may be easily recognized by the user. In particular, a value of color deviation is outside the arrow A at a size viewing angle of 45°.

In the Example (CPLf) of FIG. 6B, color deviation has directivity in a direction (direction indicated by the arrow A) where the user does not recognize color deviation. In this case, a viewing angle increases in a side direction with respect to the front, and accordingly, color deviation occurs in a blue direction and thus may not be easily recognized by the user. In particular, a value of color deviation is on the arrow A at a side viewing angle of 45°.

As shown in FIGS. 6A and 6B, desired value of color deviation may be realized by adjusting the refractive index of the capping layer 150 as a function of wavelengths.

FIGS. 7A through 7D are graphs of resonance efficiencies and light absorption rates as a function of wavelengths, according to Examples 1 through 3 and the Comparative Example.

Here, the resonance efficiencies correspond to degrees of the lights emitted from the first through third organic emission layers 143B, 143G, and 143R, which are reflected from the bottom surface of the opposite electrode 145, the interface of the opposite electrode 145 and the capping layer 150, and the interface of the capping layer 150 and the thin-film encapsulation layer 160 back to the first through third organic emission layers 143B, 143G, and 143R, and denote a ratio of the reflected lights to lights emitted from the first through third organic emission layers 143B, 143G, and 143R and incident on the opposite electrode 145.

Also, the light absorption rates denote degrees of the lights emitted from the first through third organic emission layers 143B, 143G, and 143R and incident on the opposite electrode 145 where the lights are absorbed.

Figure 7A:
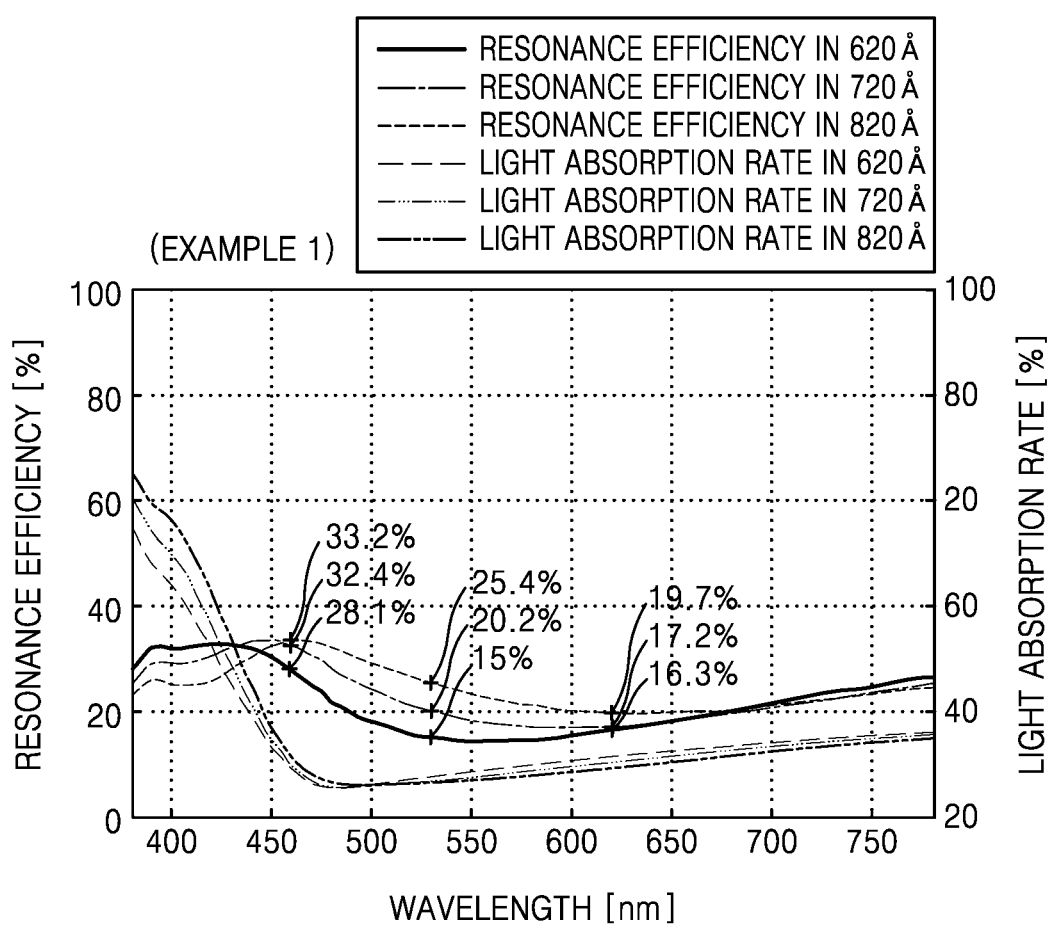
FIGS. 7A through 7D are graphs of resonance efficiencies and light absorption rates as a function of wavelengths, according to Examples 1 to 3 and the Comparative Example.

FIG. 7A illustrate resonance efficiencies and light absorption rates when the refractive indexes of the capping layer 150 of FIG. 1 according to Example 1 are 2.25, 2.01, and 1.9 respectively at 460 nm, 530 nm, and 620 nm, and when the thicknesses $t_0$ of the capping layer 150 are 620 Å, 720 Å, and 820 Å.

In other words, the refractive index of the capping layer 150 at 460 nm is higher than the refractive index at 530 nm by 11.9%, and the refractive index at 620 nm is less than the refractive index at 530 nm by 5.5%. Referring to the graph of FIG. 7A, the resonance efficiency at 460 nm is higher than the resonance efficiency at 530 nm by about 85% in the thickness of 620 Å, by about 60% in the thickness of 720 Å, and by about 30% in the thickness of 820 Å.

Figure 7B:
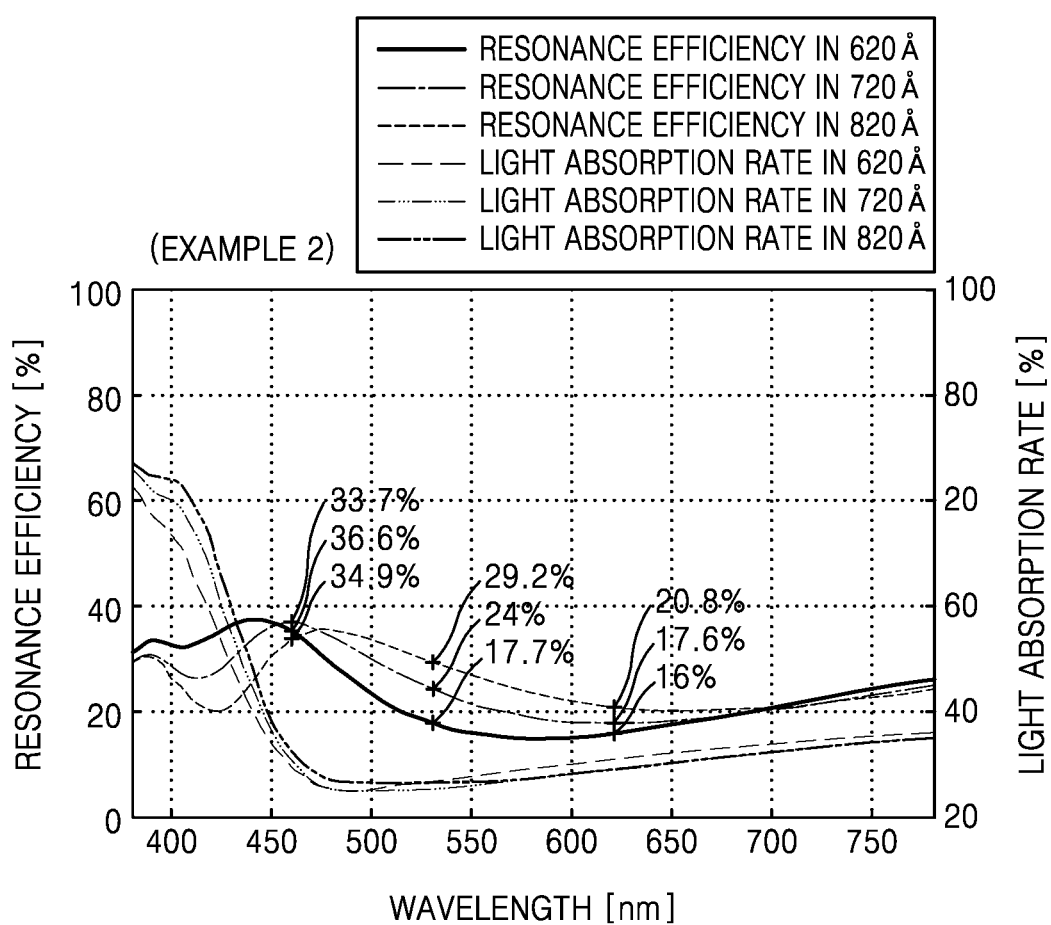

FIG. 7B illustrate resonance efficiencies and light absorption rates when the refractive indexes of the capping layer 150 of FIG. 1 according to Example 2 are 2.44, 2.15, and 2.03 respectively at 460 nm, 530 nm, and 620 nm, and when the thicknesses to of the capping layer 150 are 620 Å, 720 Å, and 820 Å.

In other words, the refractive index of the capping layer 150 at 460 nm is higher than the refractive index at 530 nm by 13.5%, and the refractive index at 620 nm is less than the refractive index at 530 nm by 5.6%. Referring to the graph of FIG. 7B, the resonance efficiency at 460 nm is higher than the resonance efficiency at 530 nm by about 95% in the thickness of 620 Å, by about 50% in the thickness of 720 Å, and by about 15% in the thickness of 820 Å.

Figure 7C:
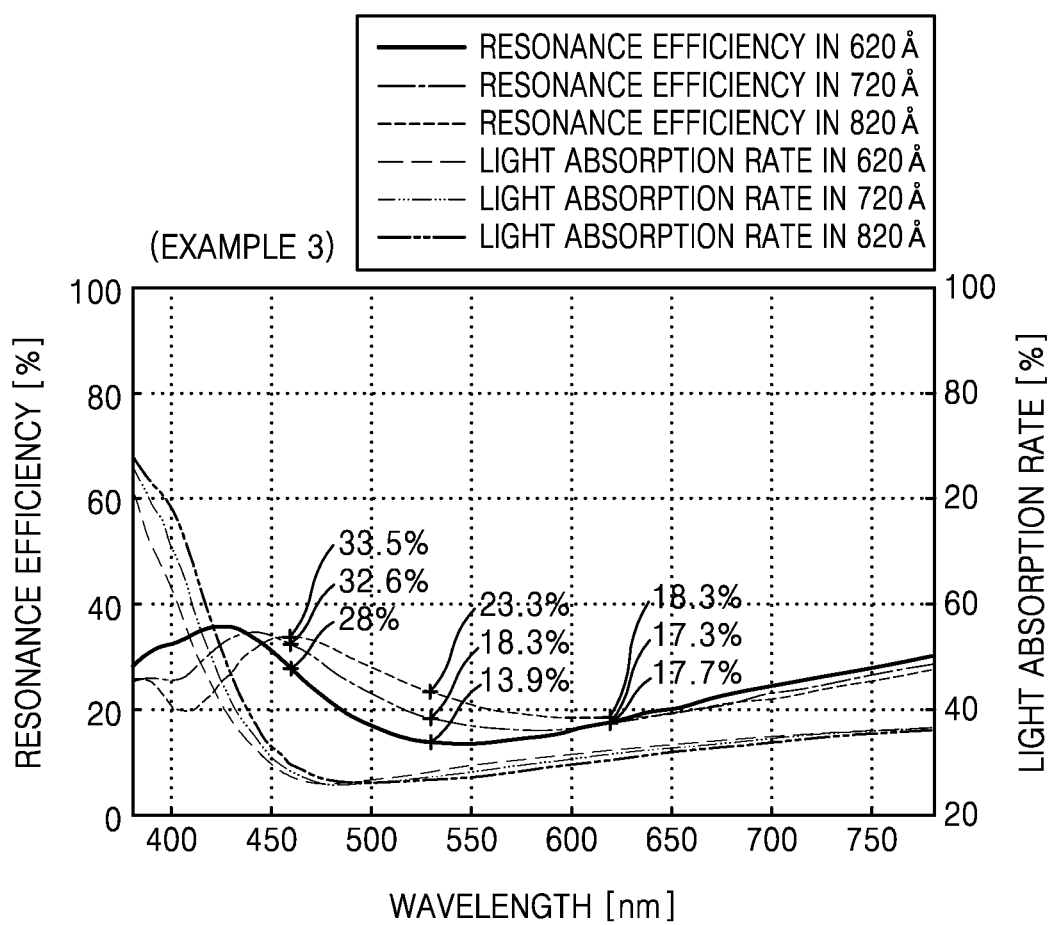

FIG. 7C illustrate resonance efficiencies and light absorption rates when the refractive indexes of the capping layer 150 of FIG. 1 according to Example 3 are 2.25, 2.01, and 1.9 respectively at 460 nm, 530 nm, and 620 nm, and when the thicknesses to of the capping layer 150 are 620 Å, 720 Å, and 820 Å.

In other words, the refractive index of the capping layer 150 at 460 nm is higher than the refractive index at 530 nm by 11.9%, and the refractive index at 620 nm is less than the refractive index at 530 nm by 5.5%. Referring to the graph of FIG. 7C, the resonance efficiency at 460 nm is higher than the resonance efficiency at 530 nm by about 100% in the thickness of 620 Å, by about 75% in the thickness of 720 Å, and by about 14% in the thickness of 820 Å.

Figure 7D:
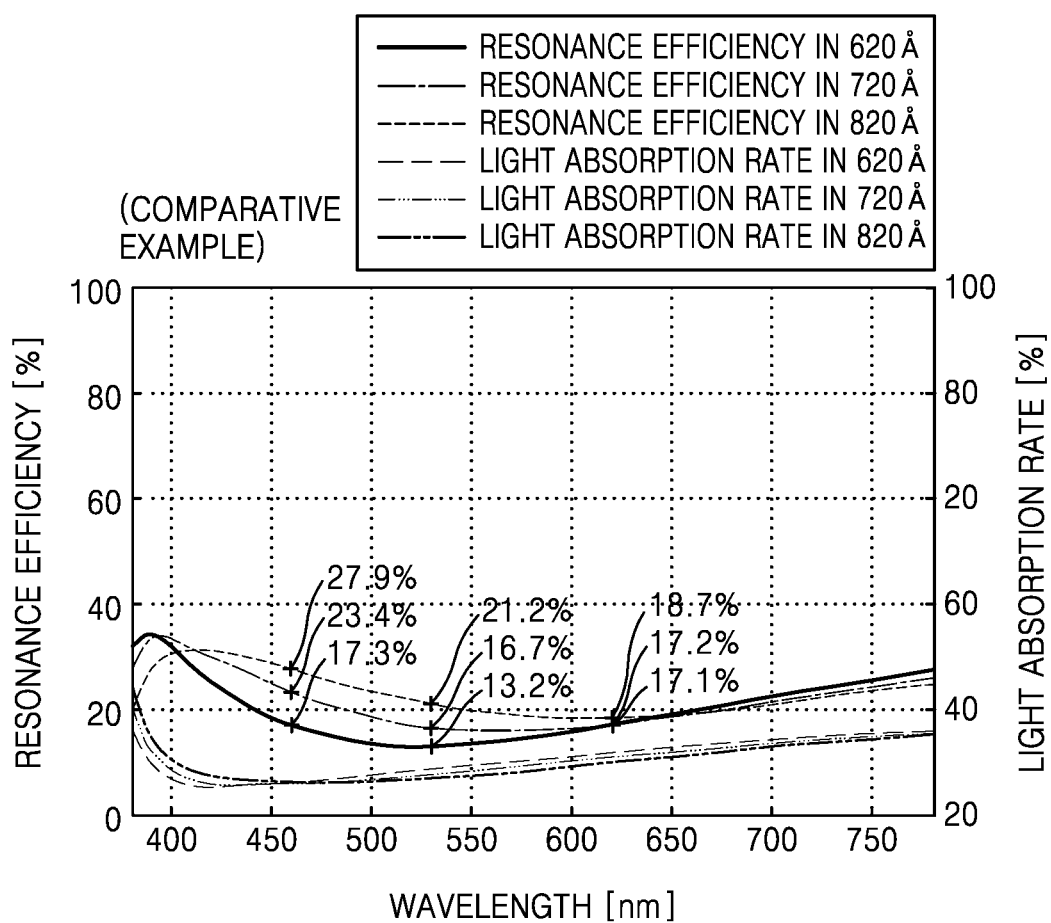

FIG. 7D illustrate resonance efficiencies and light absorption rates when the refractive indexes of the capping layer according to Comparative Example are 2.02, 1.96, and 1.93 respectively at 460 nm, 530 nm, and 620 nm, and when the thicknesses of the capping layer are 620 Å, 720 Å, and 820 Å.

In other words, the refractive index of the capping layer at 460 nm is higher than the refractive index at 530 nm by 3.1%, and the refractive index at 620 nm is less than the refractive index at 530 nm by 1.5%. Referring to the graph of FIG. 7D, the resonance efficiency at 460 nm is higher than the resonance efficiency at 530 nm by about 30% in the thickness of 620 Å, by about 40% in the thickness of 720 Å, and by about 30% in the thickness of 820 Å.

In other words, in the Comparative Example, the resonance efficiency at 460 nm is not higher than the resonance efficiency at 530 nm by at least 50%, and accordingly, the light extracting efficiency of the first sub-pixel SP1 emitting a blue light is not sufficiently higher than the light extracting efficiency of the second sub-pixel SP2 emitting a green light.

However, in Examples 1 to 3, the resonance efficiencies at 460 nm in the thicknesses of 620 Å and 720 Å are higher than the resonance efficiencies at 530 nm by at least 50%, and also by at least 100%. In other words, when a difference in the refractive indexes of the capping layer 150 according to wavelengths is equal to or greater than a certain value, the light extracting efficiency of the first sub-pixel SP1 emitting a blue light may be sufficiently high, and accordingly, color deviation according to viewing angles may have directivity.

Figure 8:
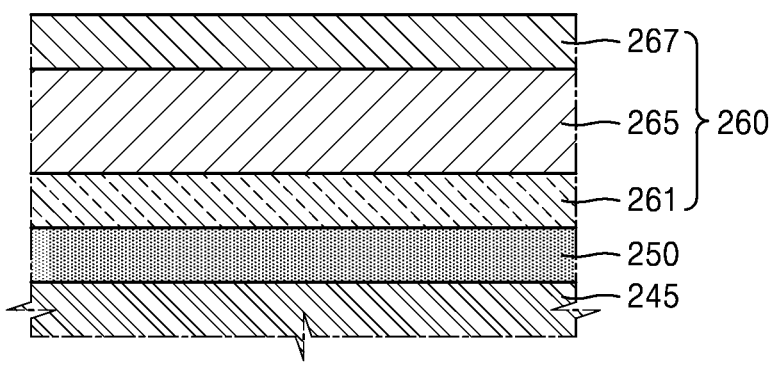
FIG. 8 is a cross-sectional view of a capping layer and a thin-film encapsulation layer according to another embodiment.

FIG. 8 is a cross-sectional view of a capping layer 250 and a thin-film encapsulation layer 260 according to another embodiment.

Referring to FIG. 8, an organic light-emitting display apparatus according to an embodiment includes the capping layer 250 disposed over an opposite electrode 245, and the thin-film encapsulation layer 260 disposed over the capping layer 250. A configuration between the substrate 110 of FIG. 1 and the opposite electrode 245 may be the same as or similar to the organic light-emitting display apparatus of FIG. 1.

The thin-film encapsulation layer 260 includes a first encapsulation inorganic film 261 and a second encapsulation inorganic film 267, and an encapsulation organic film 265 may be disposed between the first and second encapsulation inorganic film 261 and 267. Alternatively, an inorganic material, such as hexametyldisiloxane (HMDSO), that may absorb stress of an inorganic film like an organic film may be disposed between the first and second encapsulation inorganic films 261 and 267, instead of the encapsulation organic film 265.

The first and second encapsulation inorganic films 261 and 267 may each include at least one of $Al_2O_3$, $SiO_2$, $SiN_x$, and $SiO_xN_y$, and may each have a refractive index of 1.7 to 1.85.

The capping layer 250 contacts the first encapsulation inorganic film 261, and a refractive index of the capping layer 250 may be higher than a refractive index of the first encapsulation inorganic film 261.

Figure 9:
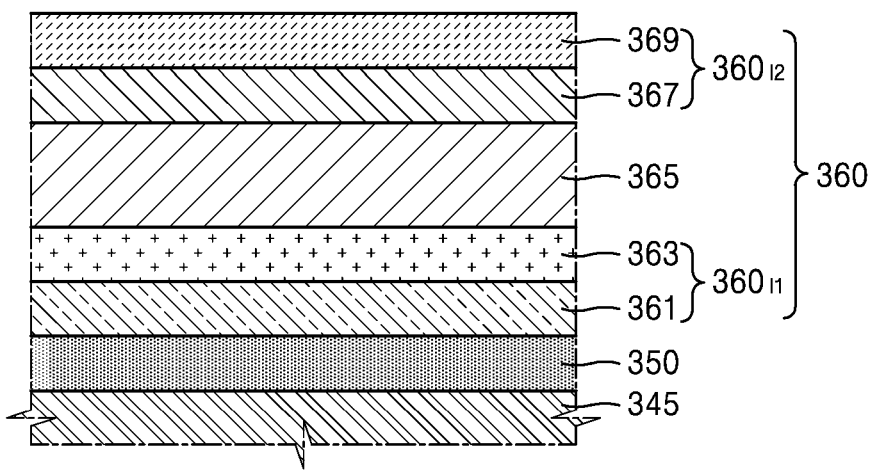
FIG. 9 is a cross-sectional view of a capping layer and a thin-film encapsulation layer according to another embodiment.

FIG. 9 is a cross-sectional view of a capping layer 350 and a thin-film encapsulation layer 360 according to another embodiment.

Referring to FIG. 9, an organic light-emitting display apparatus according to an embodiment includes the capping layer 350 disposed over an opposite electrode 345, and the thin-film encapsulation layer 360 disposed over the capping layer 350. A configuration between the substrate 110 of FIG. 1 and the opposite electrode 345 may be the same or substantially the same as or similar to the organic light-emitting display apparatus of FIG. 1.

The thin-film encapsulation layer 360 includes a first encapsulation inorganic film $360_{I1}$, an encapsulation organic film 365, and a second encapsulation inorganic film $360_{I2}$, wherein the first encapsulation inorganic film $360_{I1}$ may include a first lower encapsulation inorganic film 361 and a first upper encapsulation inorganic film 363, and the second encapsulation inorganic film $360_{I2}$ may include a second lower encapsulation inorganic film 367 and a second upper encapsulation inorganic film 369.

The first lower encapsulation inorganic film 361 may include LiF, and may have a refractive index of 1.35 to 1.45. The first upper encapsulation inorganic film 363 may include any one of $Al_2O_3$, $SiO_2$, $SiN_x$, and $SiO_xN_y$, and may have a refractive index of 1.7 to 1.85.

The second lower encapsulation inorganic film 367 and the second upper encapsulation inorganic film 369 may both include $SiN_x$, but may have different refractive indexes by being formed under different process conditions.

As shown in FIGS. 1, 8, and 9, the thin-film encapsulation layers 160, 260, and 360 may have various suitable structures, but in all cases, the lowest layers of the thin-film encapsulation layers respectively contact the capping layers 150, 250, and 350. Also, the refractive indexes of all suitable layers included in the thin-film encapsulation layers 160, 260 and 360 may respectively be lower than the refractive indexes of the capping layers 150, 250, and 350, and may each have a structure in which a high refractive layer and a low refractive layer are stacked on each other.

As such, in the organic light-emitting display apparatus including the capping layer 150, 250, or 350 and the thin-film encapsulation layer 160, 260, or 360 contacting the capping layer 150, 250, or 350, the light extracting efficiency of the first sub-pixel SP1 emitting a blue light is specifically increased, and accordingly, desired directivity may be assigned to color deviation according to viewing angles.

Such directivity of color deviation may be a direction where color deviation occurs but a user is unable to recognize the color deviation, and accordingly, the organic light-emitting display apparatus may display a high quality image.

The organic light-emitting display apparatuses according to the embodiments described above include a capping layer disposed over an opposite electrode of an OLED, and the capping layer has a certain refractive index according to wavelengths such that light efficiency is increased and color deviation according to viewing angles is realized in a direction the user does not recognize the color deviation easily.

It should be understood that embodiments described herein should be considered in a descriptive sense only and not for purposes of limitation. Descriptions of features or aspects within each embodiment should typically be considered as available for other similar features or aspects in other embodiments.

Although this invention has been described with regard to certain specific embodiments, those skilled in the art will have no difficulty devising variations of the described embodiments, which in no way depart from the scope and spirit of the present invention. Furthermore, to those skilled in the various arts, the invention itself described herein will suggest solutions to other tasks and adaptations for other applications. It is the Applicant's intention to cover by claims all such uses of the invention and those changes and modifications which could be made to the embodiments of the invention herein chosen for the purpose of disclosure without departing from the spirit and scope of the invention. Thus, the present embodiments of the invention should be considered in all respects as illustrative and not restrictive, the scope of the invention to be indicated by the appended claims and their equivalents.

What is claimed is:

1. An organic light-emitting display apparatus comprising a first sub-pixel, a second sub-pixel, and a third sub-pixel configured to emit different colors of light, the organic light-emitting display apparatus comprising:
    a substrate comprising first through third regions respectively corresponding to the first through third sub-pixels;
    first through third pixel electrodes respectively in the first through third regions of the substrate;
    a first organic emission layer over the first pixel electrode and configured to emit light having a first wavelength;
    a second organic emission layer over the second pixel electrode and configured to emit light having a second wavelength, the second wavelength being longer than the first wavelength;
    a third organic emission layer over the third pixel electrode and configured to emit light having a third wavelength, the third wavelength being longer than the second wavelength;
    an opposite electrode covering the first through third organic emission layers;
    a capping layer over the opposite electrode and having a refractive index with respect to the first wavelength that is higher than a refractive index with respect to the second wavelength by at least 7%; and
    a thin-film encapsulation layer over the capping layer.

2. The organic light-emitting display apparatus of claim 1, wherein a refractive index of the capping layer with respect to the third wavelength is less than the refractive index with respect to the second wavelength by at least 3%.

3. The organic light-emitting display apparatus of claim 1, wherein the first through third organic emission layers are respectively configured to emit a blue light, a green light, and a red light, and
    the first through third wavelengths are respectively 460 nm, 530 nm, and 620 nm.

4. The organic light-emitting display apparatus of claim 1, wherein the capping layer has the refractive index of 1.9 to 2.3 with respect to the second wavelength.

5. The organic light-emitting display apparatus of claim 1, wherein the capping layer is continuously disposed throughout the first through third sub-pixels, and a thickness of the capping layer is substantially uniform.

6. The organic light-emitting display apparatus of claim 5, wherein the thickness of the capping layer is 600 Å to 750 Å.

7. The organic light-emitting display apparatus of claim 1, wherein the thin-film encapsulation layer comprises:
    a first encapsulation inorganic film;
    an encapsulation organic film over the first encapsulation inorganic film; and
    a second encapsulation inorganic film over the encapsulation organic film.

8. The organic light-emitting display apparatus of claim 7, wherein the first encapsulation inorganic film comprises a first lower encapsulation inorganic film contacting the capping layer and a first upper encapsulation inorganic film over the first lower encapsulation inorganic film.

9. The organic light-emitting display apparatus of claim 8, wherein the first lower encapsulation inorganic film comprises lithium fluoride (LiF).

10. An organic light-emitting display apparatus comprising a first sub-pixel, a second sub-pixel, and a third sub-pixel configured to emit different colors of light, the organic light-emitting display apparatus comprising:
    a substrate comprising first through third regions respectively corresponding to the first through third sub-pixels;
    first through third pixel electrodes respectively in the first through third regions of the substrate;
    a first organic emission layer over the first pixel electrode and configured to emit light having a first wavelength;
    a second organic emission layer over the second pixel electrode and configured to emit light having a second wavelength, the second wavelength being longer than the first wavelength;
    a third organic emission layer over the third pixel electrode and configured to emit light having a third wavelength, the third wavelength being longer than the second wavelength;
    an opposite electrode covering the first through third organic emission layers;
    a capping layer over the opposite electrode and having a refractive index with respect to the first wavelength that is higher than a refractive index with respect to the second wavelength by at least 7%; and
    a thin-film encapsulation layer over the capping layer, the thin-film encapsulation layer comprising:
        a first encapsulation inorganic film comprising a first lower encapsulation inorganic film contacting the capping layer and a first upper encapsulation inorganic film over the first lower encapsulation inorganic film;
        an encapsulation organic film over the first encapsulation inorganic film; and
        a second encapsulation inorganic film over the encapsulation organic film,
    wherein a refractive index ($n_e$) of the opposite electrode, a refractive index ($n_c$) of the capping layer, a refractive index ($n_1$) of the first lower encapsulation inorganic film, a refractive index ($n_2$) of the first upper encapsulation inorganic film, and a refractive index ($n_3$) of the encapsulation organic film satisfy a condition below:
    $n_c > n_2 > n_3 > n_1 > n_e$.

11. The organic light-emitting display apparatus of claim 1, wherein a resonance efficiency of the first sub-pixel is higher than resonance efficiencies of the second and third sub-pixels by at least 50%.

12. The organic light-emitting display apparatus of claim 1, further comprising:
a first lower functional layer between the first pixel electrode and the first organic emission layer;
a second lower functional layer between the second pixel electrode and the second organic emission layer; and
a third lower functional layer between the third pixel electrode and the third organic emission layer,
wherein the first through third lower functional layers have different thicknesses.

13. The organic light-emitting display apparatus of claim 1, wherein the refractive index of the capping layer with respect to the first wavelength is higher than the refractive index of the capping layer with respect to the second wavelength by between 8% and 15%.

14. An organic light-emitting display apparatus comprising a first sub-pixel, a second sub-pixel, and a third sub-pixel configured to emit different color lights, the organic light-emitting display apparatus comprising:
first through third pixel electrodes respectively in the first through third sub-pixels;
a first organic emission layer over the first pixel electrode and configured to emit a blue light comprising a light of a first wavelength;
a second organic emission layer over the second pixel electrode and configured to emit a green light comprising a light of a second wavelength, the second wavelength being longer than the first wavelength;
a third organic emission layer over the third pixel electrode and configured to emit a red light comprising a light of a third wavelength, the third wavelength being longer than the second wavelength;
an opposite electrode continuously disposed over the first through third organic emission layers; and
a capping layer over the opposite electrode continuously throughout the first through third sub-pixels in a substantially uniform thickness, and having a refractive index with respect to the first wavelength that is higher than a refractive index with respect to the second wavelength by at least 7%.

15. The organic light-emitting display apparatus of claim 14, further comprising a thin-film encapsulation layer over the capping layer to contact the capping layer.

16. The organic light-emitting display apparatus of claim 15, wherein the thin-film encapsulation layer comprises a first lower encapsulation inorganic film, a first upper encapsulation inorganic film, an encapsulation organic film, and a second encapsulation inorganic film, which are sequentially disposed.

17. The organic light-emitting display apparatus of claim 16, wherein refractive indexes of the first lower encapsulation inorganic film, the first upper encapsulation inorganic film, the encapsulation organic film, and the second encapsulation inorganic film are respectively 1.35 to 1.45, 1.7 to 1.85, 1.45 to 1.55, and 1.7 to 1.85.

18. The organic light-emitting display apparatus of claim 14, wherein the refractive index of the capping layer with respect to the third wavelength is less than the refractive index with respect to the second wavelength by at least 3%.

19. The organic light-emitting display apparatus of claim 14, wherein the capping layer has a refractive index of 1.9 to 2.3 with respect to the second wavelength.

20. The organic light-emitting display apparatus of claim 14, wherein a thickness of the capping layer is 600 Å to 750 Å.

* * * * *